(12) United States Patent
Natori et al.

(10) Patent No.: US 11,534,929 B2
(45) Date of Patent: Dec. 27, 2022

(54) EMERGENCY STOP PRESSURE SENSOR, SAFETY DEVICE, AND SAFETY SYSTEM

(71) Applicant: Ricoh Company, Ltd., Tokyo (JP)

(72) Inventors: Junichiro Natori, Kanagawa (JP); Tsuneaki Kondoh, Kanagawa (JP); Tomoaki Sugawara, Kanagawa (JP); Mayuka Araumi, Tokyo (JP); Takahiro Imai, Tokyo (JP); Hideyuki Miyazawa, Kanagawa (JP); Mizuki Otagiri, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 354 days.

(21) Appl. No.: 16/080,902

(22) PCT Filed: Dec. 14, 2016

(86) PCT No.: PCT/JP2016/087311
§ 371 (c)(1),
(2) Date: Aug. 29, 2018

(87) PCT Pub. No.: WO2017/154303
PCT Pub. Date: Sep. 14, 2017

(65) Prior Publication Data
US 2019/0061179 A1 Feb. 28, 2019

(30) Foreign Application Priority Data

Mar. 11, 2016 (JP) .............................. JP2016-048646

(51) Int. Cl.
*H01L 41/00* (2013.01)
*B25J 19/06* (2006.01)
(Continued)

(52) U.S. Cl.
CPC .......... *B25J 19/063* (2013.01); *B25J 13/081* (2013.01); *B25J 19/028* (2013.01); *B25J 19/06* (2013.01);
(Continued)

(58) Field of Classification Search
CPC .......... B25J 13/081; B25J 19/06; H02N 1/04; H01L 41/1138
See application file for complete search history.

(56) References Cited

U.S. PATENT DOCUMENTS 10,651,363 B2 * 5/2020 Imai .................... H01L 41/1134
2004/0186626 A1 9/2004 Tsukamoto et al.
(Continued)

FOREIGN PATENT DOCUMENTS

CN 101881691 A 11/2010
CN 104049510 A 9/2014
(Continued)

OTHER PUBLICATIONS

Combined Chinese Office Action and Search Report dated Jul. 13, 2020, in Patent Application No. 201680083362.9 (with Engilsh translation), 17 pages.
(Continued)

*Primary Examiner* — Mounir S Amer
*Assistant Examiner* — Alexander Belousov
(74) *Attorney, Agent, or Firm* — Xsensus LLP (57) ABSTRACT

Emergency stop pressure sensors 17 are installed on both side surfaces of a movable link 11 of a robot arm 14 of an assembly robot. When a worker S unintentionally walks in a swing range Ra of the robot arm 14 and contacts the emergency stop pressure sensor 17, a detection signal is transmitted to a control unit 19, and the control unit 19 shuts power transmission to a driving source swinging the robot arm. The emergency stop pressure sensor 17 has a first
(Continued)

electrode and a second electrode constituting a pair of electrodes and an intermediate layer formed of rubber or a rubber composition, which is disposed between the pair of electrodes, the intermediate layer generating power upon deformation caused by contact with a contacted body (the worker). A side of the intermediate layer in a laminate direction undergoes surface modification treatment and/or inactivation treatment. With this treatment, the one side and the other side of the intermediate layer have different degrees of deformation to the same deformation adding force.

6 Claims, 9 Drawing Sheets

(51) Int. Cl.

| | | |
|---|---|---|
| *G01L 1/16* | (2006.01) | |
| *B25J 13/08* | (2006.01) | |
| *H01L 41/113* | (2006.01) | |
| *H01L 41/253* | (2013.01) | |
| *H01L 41/193* | (2006.01) | |
| *B25J 19/02* | (2006.01) | |
| *B32B 25/20* | (2006.01) | |
| *G05B 19/048* | (2006.01) | |
| *B32B 15/06* | (2006.01) | |

(52) U.S. Cl.
CPC ............... *B32B 25/20* (2013.01); *G01L 1/16* (2013.01); *G05B 19/048* (2013.01); *H01L 41/1132* (2013.01); *H01L 41/1138* (2013.01); *H01L 41/193* (2013.01); *H01L 41/253* (2013.01); *B32B 15/06* (2013.01); *B32B 2307/202* (2013.01); *G05B 2219/50198* (2013.01)

(56) References Cited

U.S. PATENT DOCUMENTS

| | | | |
|---|---|---|---|
| 2006/0238066 A1 | 10/2006 | Pelrine et al. | |
| 2008/0102262 A1* | 5/2008 | Esaki .................. | G11B 7/24056 |
| | | | 428/220 |
| 2010/0281946 A1 | 11/2010 | Naruishi et al. | |
| 2014/0270876 A1 | 9/2014 | Yamashita et al. | |
| 2016/0033343 A1 | 2/2016 | Park et al. | |
| 2016/0254389 A1* | 9/2016 | Lu ........................ | H01L 29/458 |
| | | | 257/72 |
| 2016/0276975 A1 | 9/2016 | Fujishima et al. | |
| 2016/0297997 A1* | 10/2016 | Cadiz Bedini ....... | C09D 183/16 |
| 2016/0328066 A1 | 11/2016 | Kondoh et al. | |
| 2016/0336505 A1 | 11/2016 | Arizumi et al. | |
| 2016/0341381 A1 | 11/2016 | Imai et al. | |
| 2016/0344309 A1 | 11/2016 | Otagiri et al. | |
| 2016/0358780 A1* | 12/2016 | Isogai ............... | H01L 21/28185 |
| 2017/0324023 A1 | 11/2017 | Kondoh et al. | |
| 2018/0013057 A1 | 1/2018 | Arizumi et al. | |
| 2018/0054141 A1 | 2/2018 | Natori et al. | |

FOREIGN PATENT DOCUMENTS

| | | |
|---|---|---|
| CN | 104515632 A | 4/2015 |
| EP | 1 212 800 B1 | 12/2007 |
| JP | 58-184294 A | 10/1983 |
| JP | 61-033894 A | 2/1986 |
| JP | 09-254078 A | 9/1997 |
| JP | 09-285992 A | 11/1997 |
| JP | 2003-60004 A | 2/2003 |
| JP | 2003-505865 A | 2/2003 |
| JP | 2008-087512 A | 4/2008 |
| JP | 2012-10564 A | 1/2012 |
| JP | 5714200 B2 | 3/2015 |
| WO | WO 2014/105970 A1 | 7/2014 |
| WO | WO 2015/043236 A1 | 4/2015 |
| WO | 2016/075882 A1 | 5/2016 |
| WO | 2016/117285 A1 | 7/2016 |
| WO | 2016/143251 A1 | 9/2016 |

OTHER PUBLICATIONS

Combined Chinese Office Action and Search Report dated Nov. 28, 2019 in corresponding Chinese Patent Application No. 201680083362.9 (with English translation), 19 pages.

Composite Materials: Interface in Polymer Matrix Composite, [US] Proundman, China Architecture & Building Press, Sep. 1980, pp. 170-179.

Extended European Search Report dated Feb. 20, 2019 in European Patent Application No. 16893627.6, 11 pages.

Lin, L. et al. "Triboelectric Active Sensor Array for Self-Powered Static and Dynamic Pressure Detection and Tactile Imaging", ACS Nano, XP055548561, vol. 7, No. 9, 2013, pp. 8266-8274.

Wang, S. et al. "Triboelectric nanogenerators as self-powered active sensors", Nano Energy, XP055548566, vol. 11, 2015, pp. 436-462.

International Search Report dated Jan. 17, 2017 in PCT/JP2016/087311 filed Dec. 14, 2016.

Korean Office Action dated Aug. 9, 2019 in Korean Patent Application No. 10 2018 7026025 (with English translation), 10 pages.

* cited by examiner

CORRELATION BETWEEN YOUNG'S MODULUS AND "SIGNAL OUTPUT START TIME"

EMERGENCY STOP PRESSURE SENSOR, SAFETY DEVICE, AND SAFETY SYSTEM

FIELD

The present invention relates to an emergency stop pressure sensor, a safety device, and a safety system.

BACKGROUND

For example, if a worker unintentionally walks in a move range of a movable portion of a robot delivering a product to an assembly position, the worker is likely to contact the robot. The same thing happens when something is unintentionally put in the move range of the movable portion. To reduce or prevent damage caused by sudden contact or collision, it is required to immediately sense contact, shut driving power of the moving body as soon as possible, and move the moving body in a direction opposite to the contact direction.

Such a safety device for a robot is devised that provides a hollow body on the surface of a movable portion of the robot, senses a change in pressure inside the robot when the hollow body is pressed upon contact, and stops driving of the movable portion (for example, see Patent Literature 1). In the configuration of the sensor devised in Patent Literature 1, first the hollow body is deformed, fluid inside the hollow body is compressed accordingly, and a pressure gauge outputs a signal. Thus, the sensor has low pressure-detection sensitivity upon contact. Especially when compressible fluid such as air is used, the detection markedly decreases. The contact/collision state advances until the movable portion stops driving, which makes it difficult to reduce damage.

SUMMARY

Technical Problem

To overcome the above-described problems, the present invention aims to provide an emergency stop pressure sensor that can improve pressure detection sensitivity upon contact.

Solution to Problem

In order to achieve the above object, an emergency stop pressure sensor according to the present invention is an emergency stop pressure sensor installed in a moving body capable of changing movement in response to a signal, the emergency stop pressure sensor including: a pair of electrodes; and an intermediate layer formed of rubber or a rubber composition and disposed between the pair of electrodes, the intermediate layer being configured to generate power when deformed by contact.

Advantageous Effects of Invention

According to the present invention, an emergency stop pressure sensor that can improve pressure detection sensitivity upon contact can be provided.

BRIEF DESCRIPTION OF DRAWINGS

FIG. 9 are flat views of a safety system, (a) is a drawing that illustrates a range of swing of a robot arm, and (b) is a drawing that illustrates a state of contact when a worker comes in the range of swing of the robot arm.

DESCRIPTION OF EMBODIMENTS

Embodiments of the present invention will now be described with reference to the drawings. A first embodiment is illustrated in FIG. 1 to FIG. 6.

SUMMARY

Figure 1:
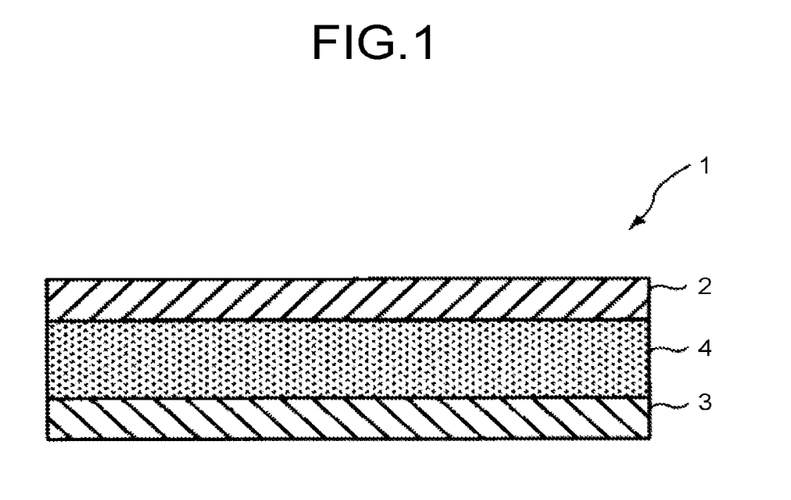
FIG. 1 is a schematic sectional drawing of an element according to a first embodiment.

FIG. 1 is a schematic sectional drawing of an element according to the embodiment. An element 1 has a first electrode 2 and a second electrode 3 facing each other and an intermediate layer 4 disposed between the first and the second electrodes and formed of rubber or a rubber composition.

DETAILS

First Electrode and Second Electrode

The materials, shapes, sizes, and structures of the first electrode and the second electrode are not specifically designated and are selectable as appropriate according to the purpose. The material, shape, size, and structure may be shared between the first electrode and the second electrode or may be unshared, although sharing is more preferable. Examples of a material for the first electrode and the second electrode include metal, a carbon-based conductive material, a conductive rubber composition, conductive polymers, and an oxide.

Examples of metal include gold, silver, copper, aluminum, stainless steel, tantalum, nickel, and phosphor bronze. Examples of a carbon-based conductive material include carbon nanotubes, carbon fibers, and graphite. Examples of a conductive rubber composition include a composition containing a conductive filler and rubber.

Examples of conductive polymers include polyethylenedioxythiophene (PEDOT), polypyrrole, and polyaniline. Examples of an oxide include indium tin oxide (ITO), indium trioxide indium zinc oxide (IZO), and zinc oxide.

Examples of the conductive filler include a carbon material (such as ketjen black, acetylene black, graphite, carbonaceous fibers, carbon fibers (CFs), carbon nanofibers (CNFs), carbon nanotubes (CNTs), and graphene), a metal filler (such as gold, silver, platinum, copper, aluminum, and nickel), a conductive polymer material (such as a derivative of any one of polythiophene, polyacetylene, polyaniline, polypyrrole, polyparaphenylene, and polyparaphenylene vinylene, and a compound made by adding a dopant, representatively an anion and a cation, to the derivative), and an ionic liquid. The above-listed compounds may be singularly used, or two or more compounds may be used in combination.

Examples of the rubber include silicone rubber, acrylic rubber, chloroprene rubber, polysulfide rubber, urethane rubber, butyl rubber, natural rubber, ethylene-propylene rubber, nitrile rubber, fluorine rubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone. The above-listed compounds may be singularly used, or two or more compounds may be used in combination. Examples of the shapes of the first electrode and the second electrode include a thin film. Examples of the structure of the first electrode and the second electrode include woven fabric, non-woven fabric, knit fabric, mesh, sponge, and non-woven fabric formed with fiber carbon materials laminated.

An average thickness of the electrode is not specifically designated and is selectable as appropriate according to the purpose. In conductivity and flexibility, the thickness is preferably from 0.01 μm to 1 mm, and more preferably, from 0.1 μm to 500 μm. The average thickness equal to or greater than 0.01 μm allows appropriate mechanical intensity, thereby improving conductivity. When the average thickness is equal to or smaller than 1 mm, the element is deformable, which provides favorable power generation performance.

Intermediate Layer

An intermediate layer is flexible. The intermediate layer satisfies at least either one of the following conditions (1) and (2).

Condition (1): when pressure is applied on the intermediate layer from a direction perpendicular to a surface of the intermediate layer, the amount of deformation in the first electrode side (one side) of the intermediate layer is different from the amount of deformation in the second electrode side (the other side) of the intermediate layer. Condition (2): universal hardness (H1) when the first electrode side of the intermediate layer is indented by 10 μm is different from universal hardness (H2) when the second electrode side of the intermediate layer is indented by 10 μm.

The intermediate layer has different amounts of deformation or different degrees of hardness between sides, which enables a great deal of power generation. In this embodiment, the amount of deformation indicates a maximum indentation depth of an indenter pressed against the intermediate layer under the following conditions.

Conditions of Measurement
Measuring device: ultra-micro hardness tester WIN-HUD of Fischerwerke GmbH & Co. KG
Indenter: quadrangular pyramidal diamond indenter having a facing angle of 136°
Initial load: 0.02 mN
Maximum load: 1 mN
A time of a load increase from the initial load to the maximum load: ten seconds Universal hardness is calculated by the following method.
Conditions of Measurement
Measuring device: ultra-micro hardness tester WIN-HUD of Fischerwerke GmbH & Co. KG
Indenter: quadrangular pyramidal diamond indenter having a facing angle of 136°
Indentation depth: 10 μm
Initial load: 0.02 mN
Maximum load: 100 mN
A time of a load increase from the initial load to the maximum load: 50 seconds The proportion (H1/H2) of the universal hardness (H1) to the universal hardness (H2) is preferably equal to or greater than 1.01, more preferably, equal to or greater than 1.07, and still more preferably, equal to or greater than 1.13. The upper limit of the proportion (H1/H2) is not particularly designated and is selectable as appropriate depending on, for example, the degree of flexibility required in use and the load in use. The upper limit is preferably equal to or smaller than 1.70. In this case, H1 is universal hardness of a relatively hard surface, whereas H2 is universal hardness of a relatively soft surface.

Any material for the intermediate layer is selectable as appropriate according to the purpose. Examples of the material may include rubber and rubber compositions. Examples of the rubber include silicone rubber, acrylic rubber, chloroprene rubber, polysulfide rubber, urethane rubber, butyl rubber, natural rubber, ethylene-propylene rubber, nitrile rubber, fluorine rubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone. The above-listed compounds may be singularly used, or two or more compounds may be used in combination. Among the compounds, silicone rubber is preferable.

Any type of silicone rubber is selectable as appropriate according to the purpose as far as the rubber has the siloxane linkage. Examples of the silicone rubber include dimethyl silicone rubber, methylphenyl silicone rubber, fluorosilicone rubber, and modified silicone rubber (including, for example, acrylic-modified, alkyd-modified, ester-modified, and epoxy-modified). The above-listed compounds may be singularly used, or two or more compounds may be used in combination. Examples of the rubber composition include a composition containing a filler and the rubber. Particularly a silicone rubber composition containing the above-described silicone rubber is preferable because of high performance in power generation.

Examples of the filler include an organic filler, an inorganic filler, and an organic-inorganic composite filler. Any type of organic filler is selectable as appropriate according to the purpose as far as the filler is an organic compound. Examples of the organic filler include acrylic fine particles, polystyrene particles, melamine particles, fluoropolymer particles such as polytetrafluoroethylene, silicone powder (silicone resin powder, silicone rubber powder, and silicone composite powder), rubber powder, wood flour, pulp, and starch. Any type of inorganic filler is selectable as appropriate according to the purpose as far as the filler is an inorganic compound. Examples of the inorganic filler include oxides, hydroxides, carbonates, sulfates, silicates, nitrides, carbon-based materials, metals, and other compounds.

Examples of the oxide include silica, diatomaceous earth, aluminum oxide, zinc oxide, titanium oxide, iron oxide, and magnesium oxide. Examples of the hydroxide include aluminum hydroxide, calcium hydroxide, and magnesium hydroxide. Examples of the carbonate include calcium carbonate, magnesium carbonate, barium carbonate, and hydrotalcite. Examples of the sulfate include aluminum sulfate, calcium sulfate, and barium sulfate. Examples of the silicate include calcium silicate (wollastonite and xonotlite), zirconium silicate, kaolin, talc, mica, zeolite, pearlite, bentonite, montmorillonite, sericite, activated clay, glass, and hollow glass beads.

Examples of the nitride include aluminum nitride, silicon nitride, and boron nitride. Examples of the carbon-based material include ketjen black, acetylene black, graphite, carbon fibers, carbon fibers, carbon nanofibers, carbon nanotubes, fullerenes (and derivatives), and graphene. Examples of the metal include gold, silver, platinum, copper, iron, aluminum, and nickel. Examples of the other compounds include potassium titanate, barium titanate, strontium titanate, lead zirconate titanate, silicon carbide, and molybdenum sulfide. The inorganic filler may undergo surface treatment.

Any type of the organic-inorganic composite filler is selectable as far as the filler is a compound made by combining an organic compound and an inorganic compound at the molecular level. Examples of the organic-inorganic composite filler include silica-acrylic composite particles and silsesquioxane. The average particle diameter of the filler is not particularly designated and is selectable as appropriate according to the purpose. The diameter is preferably from 0.01 μm to 30 μm, and more preferably, from 0.1 μm to 10 μm. The average particle diameter equal to or greater than 0.01 μm may improve power generation performance. When the average particle diameter is equal to or smaller than 30 μm, the intermediate layer is deformable, which can enhance power generation performance.

The average particle diameter can be measured by using a known particle size measurement device such as Microtrac HRA (Nikkiso Co., Ltd.) and a known method. The content of the filler is preferably from 0.1 parts by mass to 100 parts by mass, and more preferably, from 1 part by mass to 50 parts by mass to the rubber of 100 parts by mass. The content equal to or greater than 0.1 parts by mass may improve power generation performance. When the content is equal to or smaller than 100 parts by mass, the intermediate layer is deformable, which can enhance power generation performance. Other components can be used without specific limitation and are selectable as appropriate according to the purpose. Examples of the other components include additives. The content of the other components is selectable as appropriate in a range without departing from aims of the present invention.

Examples of the additive include crosslinkers, reaction control agents, fillers, reinforcing materials, antioxidants, conductivity control agents, colorants, plasticizers, processing aids, flame retardants, ultraviolet absorbers, tackifiers, and thixotropic agents. Any method of preparing materials constituting the intermediate layer is selectable as appropriate according to the purpose. As an exemplary method of preparing the rubber composition, the rubber composition can be prepared by mixing the rubber, the filler, and other components as necessary and kneading and diffusing the mixed compound. Any method of forming the intermediate layer is selectable as appropriate according to the purpose. Examples of the method of forming a thin film of the rubber composition include a method of applying the rubber composition to a base material by blade coating, die coating, dip coating, and other manners and curing the rubber composition with heat and electron beams.

An average thickness of the intermediate layer is not specifically designated and is selectable as appropriate according to the purpose. In conformability to shape deformation, the thickness is preferably from 1 μm to 10 mm, more preferably, from 20 μm to 1 mm. The average thickness in a preferable range ensures film formation and does not involve the inhibition of deformation, which results in efficient power generation.

The intermediate layer is preferably insulated. For the insulation property, the intermediate layer preferably has volume resistivity equal to or greater than $10^8$ Ωcm, and more preferably, equal to or greater than $10^{10}$ Ωcm. The intermediate layer may have a multi-layered structure.

Surface Modification Treatment and Inactivation Treatment

Surface modification treatment and inactivation treatment are exemplary methods for having the intermediate layer have different amounts of deformation or different degrees of hardness between the sides. Both the surface modification treatment and the inactivation treatment or either one of them may be conducted.

Surface Modification Treatment

Examples of the surface modification treatment include plasma treatment, corona discharge treatment, electron beam radiation treatment, ultraviolet radiation treatment, ozone treatment, and irradiation (including X-rays, α-rays, β-rays, γ-rays, and neutron beams) treatment. Among the methods of treatment, plasma treatment, corona discharge treatment, and electron beam radiation treatment are preferable in the speed of treatment; however, any method is applicable as far as the method has a certain amount of radiation energy and is capable of modifying the material.

Plasma Treatment

Plasma treatment can be performed by using a plasma generator including, for example, the parallel-plate type, the capacitive coupling type, and the inductive coupling type, and an atmospheric pressure plasma jet. In durability, low pressure plasma treatment is preferable. The reaction pressure for plasma treatment is not specifically designated and is selectable as appropriate according to the purpose. The reaction pressure is preferably from 0.05 Pa to 100 Pa, and more preferably, from 1 Pa to 20 Pa. Any reaction atmosphere in the plasma treatment is selectable as appropriate according to the purpose. For example, inert gas, rare gas, and oxygen are effective, and argon is more preferably in sustainability of the effect.

The oxygen partial pressure is preferably equal to or smaller than 5000 ppm. Oxygen partial pressure equal to or smaller than 5000 ppm in the reaction atmosphere can prevent generation of ozone and reduce use of an ozone treatment device. The radiation power in the plasma treatment is defined by (output×the irradiation time). The radiation power is preferably from 5 Wh to 200 Wh, and more preferably from 10 Wh to 50 Wh. The radiation power in a preferable range allows the intermediate layer to have a power generation function and causes no reduction in durability due to excessive radiation.

Corona Discharge Treatment

The applied energy (cumulative energy) in the corona discharge treatment is preferably from 6 J/cm$^2$ to 300 J/cm$^2$, and more preferably from 12 J/cm$^2$ to 60 J/cm$^2$. The applied energy in a preferable range allows the intermediate layer to have a power generation function and causes no reduction in durability due to excessive radiation.

Electron Beam Radiation Treatment

The amount of radiation in the electron beam radiation treatment is preferably equal to or greater than 1 kGy, and more preferably, from 300 kGy to 10 MGy. The amount of radiation in a preferable range allows the intermediate layer to have a power generation function and causes no reduction in durability due to excessive radiation. Any reaction atmosphere for the electron beam radiation treatment is selectable as appropriate according to the purpose. The oxygen partial pressure is preferably equal to or smaller than 5000 ppm by filling inert gas such as argon, neon, helium and nitrogen. Oxygen partial pressure equal to or smaller than 5000 ppm in the reaction atmosphere can prevent generation of ozone and reduce use of an ozone treatment device.

Ultraviolet Radiation Treatment

Ultraviolet in the ultraviolet radiation treatment preferably has a wavelength between 200 nm and 365 nm inclusive, and more preferably between 240 nm and 320 nm inclusive. The ultraviolet dose in the ultraviolet radiation treatment is preferably from 5 J/cm$^2$ to 500 J/cm$^2$, and more preferably from 50 J/cm$^2$ to 400 J/cm$^2$. The ultraviolet dose in a preferable range allows the intermediate layer to have a power generation function and causes no reduction in durability due to excessive radiation.

Any reaction atmosphere for the electron beam radiation treatment is selectable as appropriate according to the purpose. The oxygen partial pressure is preferably equal to or smaller than 5000 ppm by filling inert gas such as argon, neon, helium and nitrogen. Oxygen partial pressure equal to or smaller than 5000 ppm in the reaction atmosphere can prevent generation of ozone and reduce use of an ozone treatment device.

Such a technique is conventionally developed that forms an active group by causing excitation or oxidation by plasma treatment, corona discharge treatment, ultraviolet radiation treatment, electron beam radiation treatment, and the like and increases adhesion of an interlayer. The technique is, however, applicable only to an interlayer, and application to the outermost surface decreases releasability and thus is not preferable. The reaction is conducted in an oxygen rich atmosphere such that a reactive active group (a hydroxyl group) is effectively induced. This conventional technique is therefore essentially different from the surface modification treatment of this embodiment.

The surface modification treatment (for example, plasma treatment) in this embodiment is conducted in a low-pressure reaction environment with less oxygen, which increases re-crosslinks and chemical bonds on the surface. Consequently, durability is improved with "an increase in the Si—O bonds having higher binding energy". Furthermore, releasability is considered to be improved because of "densification with an increase in the crosslink density". Although active groups are partially formed in this embodiment, the active groups are inactivated using a later-described coupling agent and air-dried processing.

Inactivation Treatment

A surface of the intermediate layer may undergo inactivation treatment as appropriate using various materials. Any kind of inactivation treatment is selectable as appropriate according to the purpose as far as the treatment is conducted to inactivate the surface of the intermediate layer. Examples of the treatment include treatment adding an inactivator to the surface of the intermediate layer. Inactivation is a process to change properties of the surface of the intermediate layer such that chemical reaction is less likely to be caused. This change is obtained by reacting an active group (such as —OH) generated by excitation or oxidation using, for example, plasma treatment, corona discharge treatment, ultraviolet radiation treatment, and electron beam radiation treatment with an inactivator and reducing the activation level of the surface of the intermediate layer.

Examples of the inactivator include amorphous resin and a coupling agent. Examples of the amorphous resin include resin having a perfluoropolyether structure in its main chain. Examples of the coupling agent include a metal alkoxide and solution containing a metal alkoxide.

Examples of the metal alkoxide include compounds of the following general formula (1), partial hydrolysis polycondensate thereof having a degree of polymerization of approximately 2 to 10, and a mixture thereof.

$$R^1_{(4-n)}Si(OR^2)_n \qquad \text{general formula (1)}$$

In the general formula (1), each of $R^1$ and $R^2$ independently represents either one of a straight-chain or branched alkyl group having one to ten carbon atoms, an alkylpolyether chain, and an aryl group. In the formula, n is an integer of 2 to 4.

Inactivation treatment is conducted, for example, by providing the surface modification treatment on an intermediate layer precursor such as rubber and impregnating the surface of the intermediate layer precursor with an inactivator by, for example, applying or dipping the inactivator. If silicone rubber is used for the intermediate layer precursor, the rubber may be deactivated by being placed in the air and air-dried after the surface modification treatment.

The oxygen concentration profile in the thickness direction of the intermediate layer preferably has a maximal value, whereas the carbon concentration profile in the thickness direction of the intermediate layer preferably has a minimal value. In the intermediate layer, it is more preferable that a position at which the oxygen concentration profile indicates the maximal value match a position at which the carbon concentration profile indicates the minimal value. The oxygen concentration profile and the carbon concentration profile can be calculated using the X-ray photoelectron spectroscopy (XPS). An exemplary method of measurement is given as follows.

Method of Measurement

Measuring device: Ulvac-PHI QuanteraSXM of ULVAC-PHI, Incorporated.
Measurement light source: Al (mono)
Measurement output: 100 μmϕ, 25.1 W
Measurement area: 500 μm×300 μm
Pass energy: 55 eV (narrow scan)
Energy step: 0.1 eV (narrow scan)
Relative response factor: use the relative response factor of PHI
Sputtering source: C60 cluster ion
Ion Gun output: 10 kV, 10 nA
Raster Control: (X=0.5, Y=2.0) mm
Sputtering rate: 0.9 nm/min (in SiO$_2$)

With XPS, the present concentration ratio and a bonding state of atoms in the measurement target object can be observed by capturing electrons emitted by the photoelectric effect.

Figure 2:
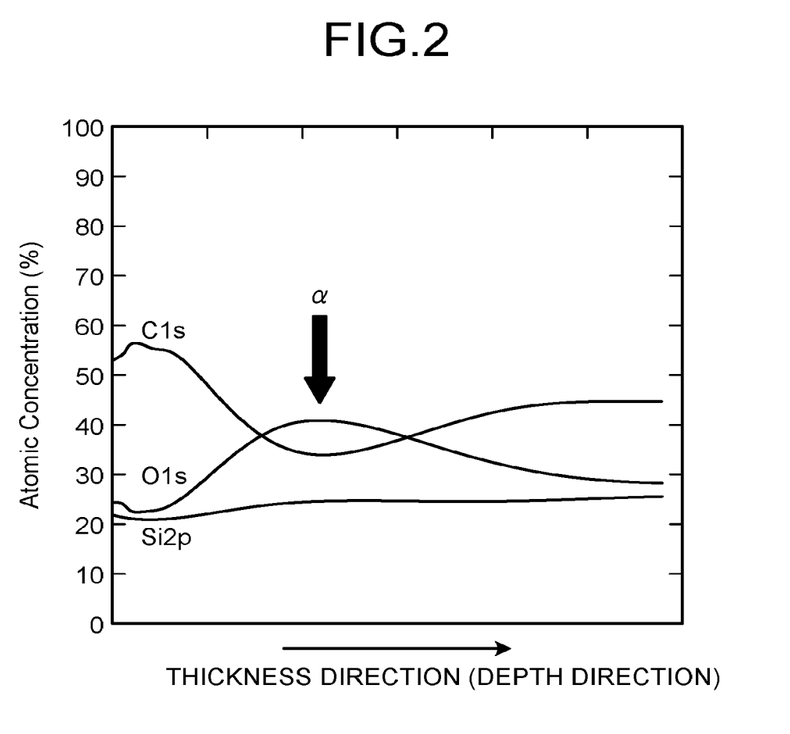
FIG. 2 is a characteristic diagram that illustrates results of XPS measurement of an intermediate layer (silicone rubber) having undergone surface modification treatment and inactivation treatment.

Silicone rubber has the siloxane linkage and is constituted mainly by Si, O, and C. In use of silicone rubber for a material of the intermediate layer, a wide-scan spectrum of XPS is measured, and the present concentration ratio of an atom present inside from the surface layer in the depth direction can be calculated based on the relative peak intensity ratio between the elements. FIG. 2 illustrates an example. In this example, atoms Si, O, and C are present, and the present concentration ratio is measured in (atomic %). FIG. 2 illustrates a sample of an intermediate layer that is made of silicone rubber and has undergone the surface modification treatment (plasma treatment) and the inactivation treatment. In FIG. 2, the abscissa gives the analysis depth in the inward direction from the surface, whereas the ordinate gives the present concentration ratio.

Figure 3:
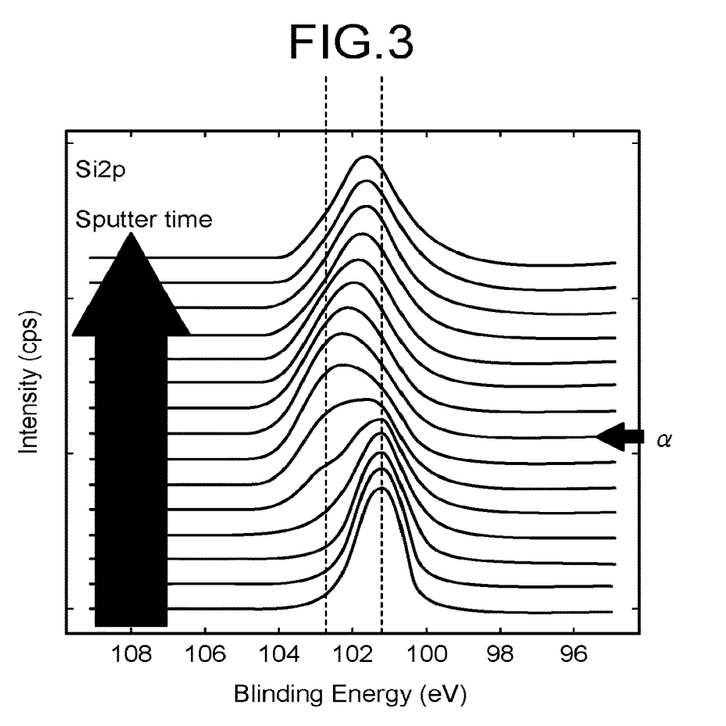
FIG. 3 is a graph that illustrates changes in Si2p binding energy of the intermediate layer measured in FIG. 2 in the thickness direction.

In use of silicone rubber, an element bonded to silicon and the bonding state can be observed by measuring energy of electrons emitted from the 2p orbital of Si. A chemical bonding state was therefore obtained by separating peaks from a narrow-scan spectrum on the Si2p orbital representing the bonding state of Si. FIG. 3 illustrates the results. The measured object in FIG. 3 is the sample used for measurement in FIG. 2. In FIG. 3, the abscissa gives the binding energy, whereas the ordinate gives the intensity ratio. Measurement spectra in the depth direction are illustrated from the bottom toward the top. In general knowledge, the amount of peak shift depends on the bonding state. In silicone rubber of this case, a peak shifting to the high-energy side on the Si2p orbital means an increase in the number of oxygen atoms bonded to Si.

When silicone rubber undergoes surface modification treatment and inactivation treatment, from the surface layer toward the inside, the oxygen content increases to have a maximal value and the carbon content decreases to have a minimal value. The analysis further conducted in the depth direction indicates that the oxygen content is decreased, whereas the carbon content is increased, and the atom present concentrations become substantially equal to those of untreated silicone rubber. The maximal value of oxygen detected at the point α in FIG. 2 is consistent with the shift of Si2p binding energy to the high-energy side (the position α in FIG. 3), which indicates that an increase in oxygen content results from the number of oxygen atoms bonded to Si.

Figure 4:
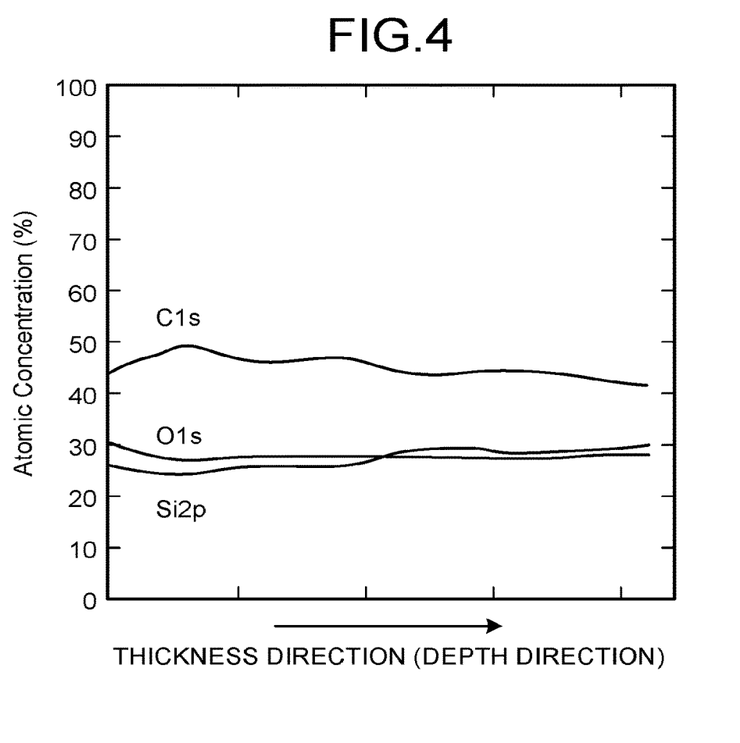
FIG. 4 is a characteristic diagram that illustrates results of XPS measurement of an untreated intermediate layer (silicone rubber).
Figure 5:
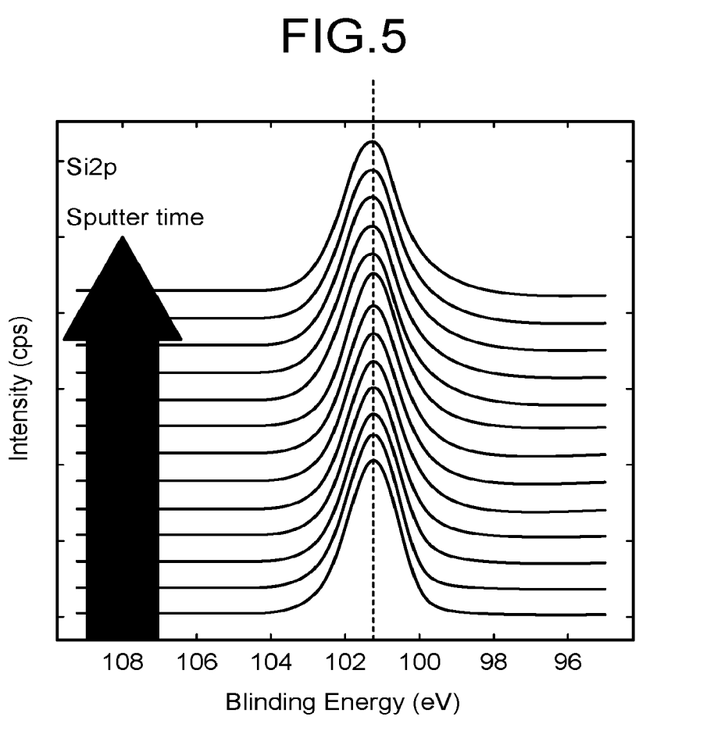
FIG. 5 is a graph that illustrates changes in Si2p binding energy of the intermediate layer measured in FIG. 4 in the thickness direction.

FIG. 4 and FIG. 5 indicate results when the same analysis is performed on untreated silicone rubber. In FIG. 4, neither maximal values of oxygen content nor minimal values of carbon content are observed unlike in FIG. 2. Furthermore, in FIG. 5, no trends are observed that Si2p binding energy shifts to the high-energy side. Thus, no changes are recognized in the number of oxygen atoms bonded to Si.

As described above, an inactivator such as a coupling agent permeates the intermediate layer by impregnating the intermediate layer with the inactivator by applying or dipping the inactivator onto the surface of the intermediate layer. If the coupling agent is a compound of the general formula (1), polyolganosiloxan becomes present in the intermediate layer with a certain concentration distribution. In this distribution, the oxygen atom included in polyolganosiloxan has a maximal value in the depth direction. The intermediate layer therefore contains polyorganosiloxane having a silicon atom bonded with three to four oxygen atoms.

A method of inactivation treatment is not limited to a dipping method. Any other methods are applicable such as plasma-enhanced chemical vapor deposition (CVD), physical vapor deposition (PVD), sputtering, vacuum deposition, and catalytic chemical vapor deposition as far as the oxygen atom contained in polyolganosiloxan has a maximal value in the depth direction (the thickness direction) of the intermediate layer, in the distribution.

The intermediate layer does not need to have initial surface potential in a stationary state. The initial surface potential in a stationary state can be measured by the following conditions of measurement. In this case, having no initial surface potential means that the potential is within ±10 V when measured using the following conditions of measurement.

Conditions of Measurement

Pre-processing: place the sample in the atmosphere of temperature 30° C. and relative humidity 40% for 24 hours and thereafter perform static electricity removal for 60 seconds (using SJ-F300 of KEYENCE Corporation).
Device: Treck Model 344
Measuring probe: 6000B-7C
Distance of measurement: 2 mm
Spot diameter of measurement: diameter of 10 mm In the element of this embodiment, charging by a mechanism alike triboelectric charging and a surface electric potential difference resulting from inside charge retention are considered to cause unevenness of capacitance based on a difference in the amount of deformation resulting from the difference in hardness between both sides of the intermediate layer. This structure is therefore considered to cause move of the charge and generate power. The element preferably has a space between the intermediate layer and at least either one of the first electrode and the second electrode. This configuration can increase power generation. Any manner of arranging the space is selectable as appropriate according to the purpose. For example, a spacer may be disposed between the intermediate layer and at least either one of the first electrode and the second electrode.

The material, form, shape, size, and others of the spacer are not specifically designated and are selectable as appropriate according to the purpose. Examples of a material for the spacer include a polymer material, rubber, metal, conductive polymers, and a conductive rubber composition. Examples of the polymer material include polyethylene, polypropylene, polyethylene terephthalate, polyvinyl chloride, polyimide resin, fluororesin, and acrylic resin. Examples of the rubber include silicone rubber, acrylic rubber, chloroprene rubber, polysulfide rubber, urethane rubber, butyl rubber, natural rubber, ethylene-propylene rubber, nitrile rubber, fluorine rubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone.

Examples of the metal include gold, silver, copper, aluminum, stainless steel, tantalum, nickel, and phosphor bronze. Examples of the conductive polymer material include polythiophene, polyacetylene, and polyaniline. Examples of the conductive rubber composition include a composition containing a conductive filler and rubber. Examples of the conductive filler include a carbon material (such as ketjen black, acetylene black, graphite, carbon fibers, carbon nanofibers, carbon nanotubes, and graphene), metal (such as gold, silver, platinum, copper, iron, aluminum, and nickel), a conductive polymer material (such as a derivative of any one of polythiophene, polyacetylene, polyaniline, polypyrrole, polyparaphenylene, and polyparaphenylene vinylene, and a compound made by adding a dopant, representatively an anion and a cation, to the derivative), and an ionic liquid.

Examples of the rubber include silicone rubber, acrylic rubber, chloroprene rubber, polysulfide rubber, urethane rubber, butyl rubber, natural rubber, ethylene-propylene rubber, nitrile rubber, fluorine rubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone. Examples of the form of the spacer include sheet, film, woven fabric, non-woven fabric, mesh, and sponge. The shape, size, thickness, and installation layout of the spacer are selectable as appropriate based on the structure of an element.

Figure 6:
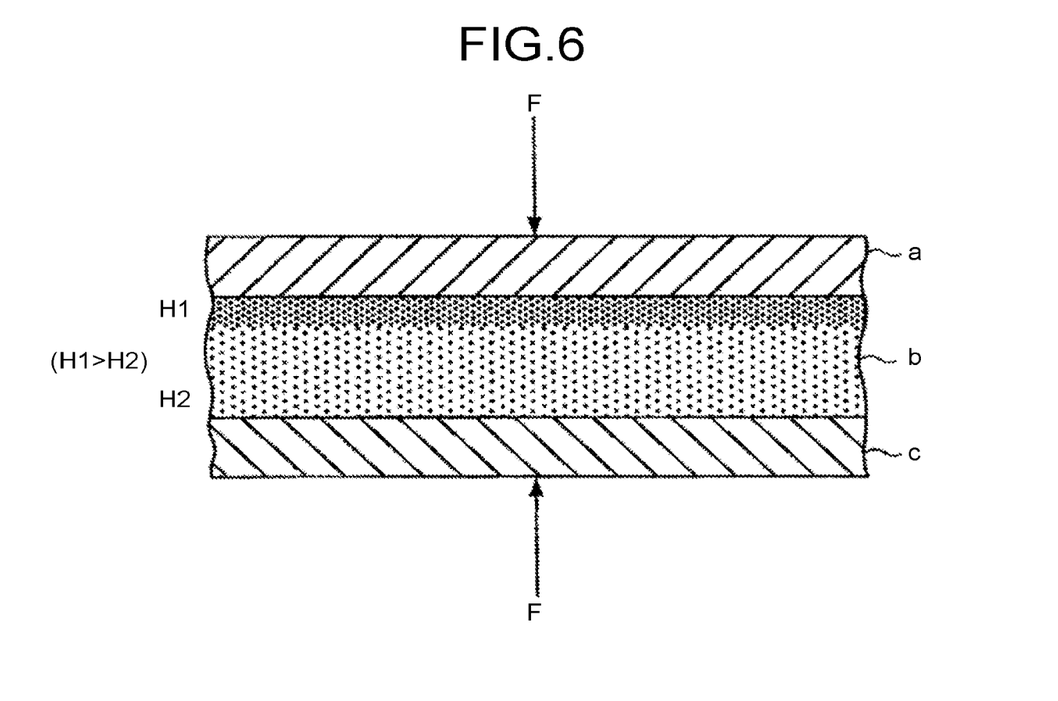
FIG. 6 is an illustrative schematic sectional drawing of characteristics of an element having an intermediate layer having undergone surface modification treatment and inactivation treatment.

As illustrated in FIG. 6, the first electrode is indicated as a, the intermediate layer is indicated as b, and the second electrode is indicated as c. When the first electrode a side of the intermediate layer b undergoes the surface modification treatment or the inactivation treatment, the first electrode a side of the intermediate layer b becomes harder than the second electrode c side. Universal hardness is therefore given as H1>H2. When the same pressure F as a deformation adding force acts on the first electrode a side and the second electrode c side, the degree of deformation in the first electrode a side of the intermediate layer b is smaller than that in the second electrode c side.

Figure 7:
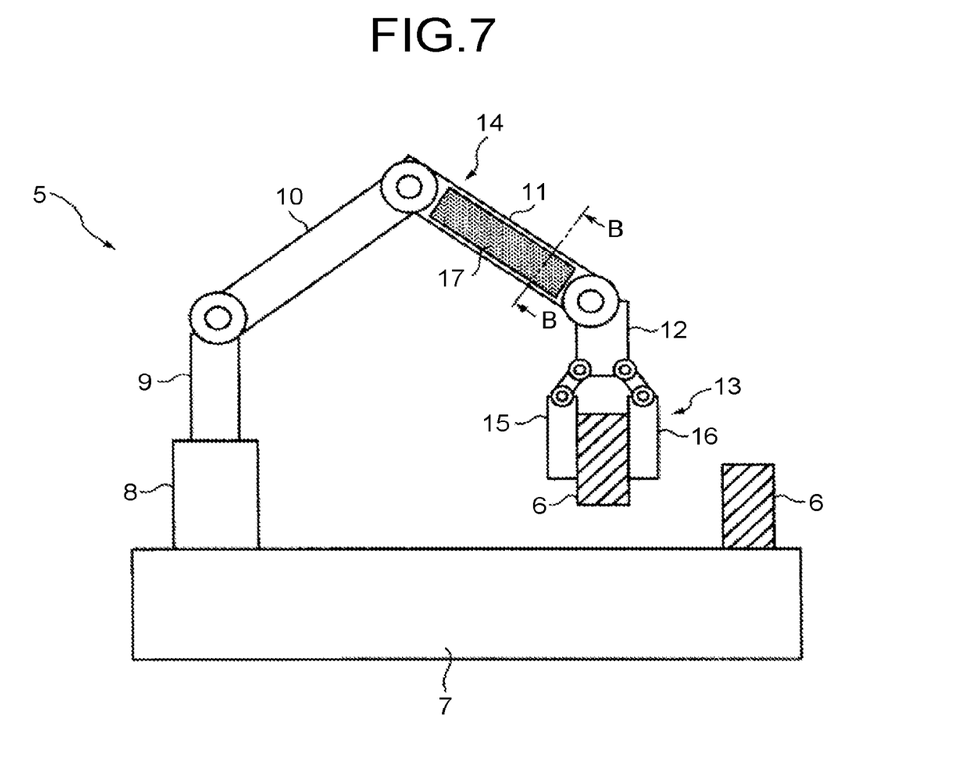
FIG. 7 is a schematic drawing of an exemplary robot according to a second embodiment.

A second embodiment will now be described with reference to FIG. 7 to FIG. 14. FIG. 7 illustrates a robot as a moving body according to this embodiment. A robot 5 is configured in a manner capable of changing movement in response to control using a signal and is, for example, an assembly robot used in a manufacturing line. In this case, "changing movement" means stopping movement and reverse movement for releasing a contact state.

The robot 5 includes a base 7 on which a part 6 serving as a gripped member is placed, a support shaft 8 fixed to the base 7, a fixed link 9 fixed to the support shaft 8, movable links 10, 11, and 12, and a gripping device 13 provided to the movable link 12 disposed in the front end. A robot arm 14 as a movable unit is configured with the support shaft 8, the fixed link 9, the movable links 10, 11, and 12, and the gripping device 13.

The part 6 gripped by the gripping device 13 is carried to an assembly position with displacement movement by the robot arm 14. The gripping device 13 has a pair of closable and openable gripping units 15 and 16. An emergency stop pressure sensor 17 in a film shape is provided to an outer surface of the movable link 11 by means of adhesion or the like.

Figure 8:
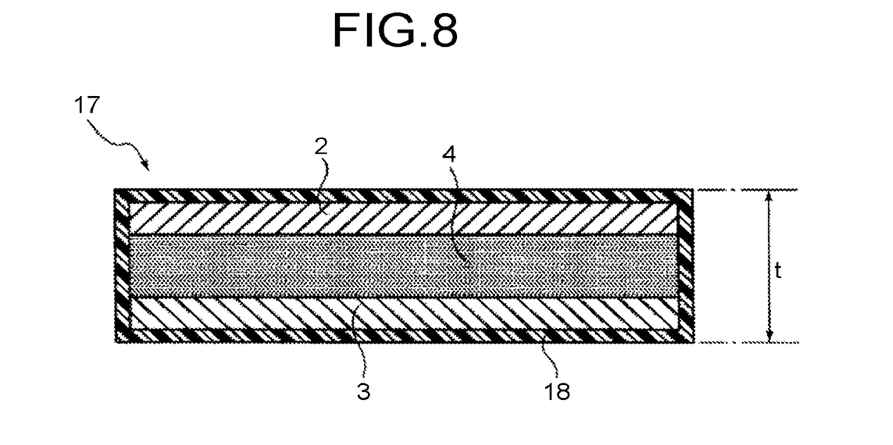
FIG. 8 is a sectional drawing of an emergency stop pressure sensor along B-B line of FIG. 7.

The emergency stop pressure sensor 17 is constituted by an element 1 illustrated in FIG. 1 and has the first electrode 2 and the second electrode 3 as a pair of electrodes, the intermediate layer 4, and a cover 18 as illustrated in FIG. 8. The intermediate layer 4 is a piezoelectric body made of rubber or a rubber composition, disposed between the pair of electrodes, and generating power when deformed by contact with a contacted body. The cover 18 is flexible and covers at least a surface of the first electrode 2 in a side contacting the contacted body of the pair of electrodes. In this embodiment, the cover 18 covers the entire periphery of a laminate in which both sides of the intermediate layer 4 in the thickness direction are sandwiched by the pair of electrodes.

The cover 18 is mainly used for protection of the first electrode 2 from a contact with a contacted body and has a thickness and material properties (hardness) that do not disturb transmission of contact pressure to the intermediate layer 4. For example, polyethylene terephthalate (PET) can be used for the material of the cover 18. Although the thickness of the emergency stop pressure sensor 17 is illustrated in an emphasized manner in FIG. 8, the actual thickness is only a few hundred micrometers.

The interlayers between the first electrode 2 and the intermediate layer 4 and between the second electrode 3 and the intermediate layer 4 may be connected or unconnected or may be partially connected. As described above, the intermediate layer 4 is made of rubber or a rubber composition and has a side in the laminate direction undergoing the surface modification treatment and/or the inactivation treatment. This structure causes different degrees of deformation between the side and the other side to the same deformation adding force and allows charge to be accumulated. At unconnected portions between the first electrode 2 and the intermediate layer 4 and between the second electrode 3 and the intermediate layer 4, deformation causes triboelectric charging or separating charging between the intermediate layer 4 and a facing electrode, and charge is accumulated. Furthermore, capacitance is changed between the intermediate layer 4 and the electrode, and power is generated. At connected portions between the first electrode 2 and the intermediate layer 4 and between the second electrode 3 and the intermediate layer 4, capacitance is changed between the intermediate layer 4 and the electrode upon deformation, and power is accordingly generated.

Figure 9:
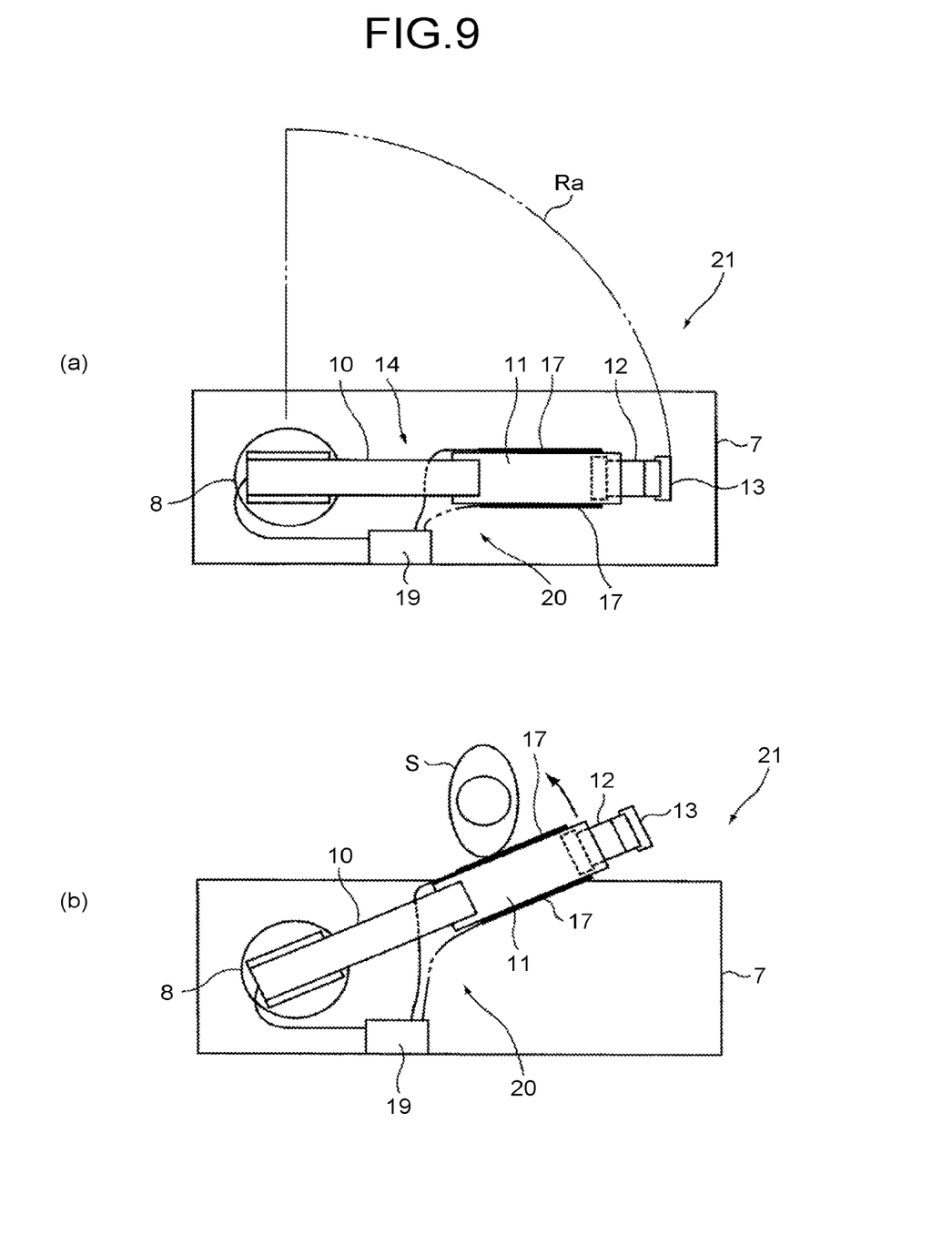

FIG. 9 are flat views of the robot 5 illustrated in FIG. 7. In FIG. 9(a), an area Ra indicated by a double dots chain line indicates a move range (swing range) of the robot 5. The emergency stop pressure sensors 17 are provided to both sides of the movable link 11. In FIG. 9, the thickness of each emergency stop pressure sensor 17 is illustrated in an emphasized manner.

A control unit 19 implemented by a microcomputer is installed in the base 7. The control unit 19 is electrically connected with a driving source to drive swingably driving the robot arm 14 and with an electrode of each of the emergency stop pressure sensors 17 through lead wires. Signals may be wirelessly transmitted and received between, for example, the control unit 19 and the driving source for swingably driving the robot arm 14.

A safety device 20 is constituted by the emergency stop pressure sensors 17 and the control unit 19, and a safety system 21 is constituted by the safety device 20 and the robot 5 as a moving body. In FIG. 7, the control unit 19 and lead wires are not illustrated. As illustrated in FIG. 9(b), when a worker S unintentionally walks in the swing range of the robot arm 14 while the robot 5 is moving, the worker S may collide against the movable link 11 of the robot arm 14 and may be injured. As described later, the emergency stop pressure sensor 17 according to the embodiment has markedly high sensitivity for pressure detection upon contact. With the properties, when the emergency stop pressure sensor 17 contacts the worker S, a detection signal is output to the control unit 19 almost simultaneously with the contact. The control unit 19 shuts power transmission to the swing driving source of the robot arm 14 and stops swinging of the robot arm 14.

In addition to stopping swinging of the robot arm 14, the control unit 19 may reversely move the robot arm 14 in a manner releasing the contact state. This configuration allows immediate sensing of contact, which can reduce or prevent damage such as injury and breakage caused with the collision state advancing. In this embodiment, the emergency stop pressure sensor 17 is installed in the movable link 11; however, the embodiment is not limited to this configuration. The emergency stop pressure sensor 17 can be installed as appropriate in any range likely to contact humans and objects. The emergency stop pressure sensor 17 according to the embodiment has a thin sheet-like shape. This shape can prevent the outer appearance from being bulky and being spoiled due to formation of a plurality of hollow bodies as described in Patent Literature 1.

Use of a conventionally known piezoelectric element and polyvinylidene fluoride (PVDF) for the pressure sensor may also be effective for the problems of bulky and spoiled outer appearance. These types of pressure sensor, however, do not have pressure detection sensitivity sufficient to immediately stop the robot arm 14. Furthermore, use of a ceramic-based piezoelectric element may need frequent replacement at each breakage upon collision.

Comparative evaluations relating to sensitivity of the emergency stop pressure sensor 17 according to the embodiment were conducted. The comparative evaluations were performed in such a manner that presses a probe using a tackiness tester and comparing times before sensing the added pressure. As the outline of the evaluation method, the following three procedures were conducted using each sensor, and data was obtained.

Figure 10:
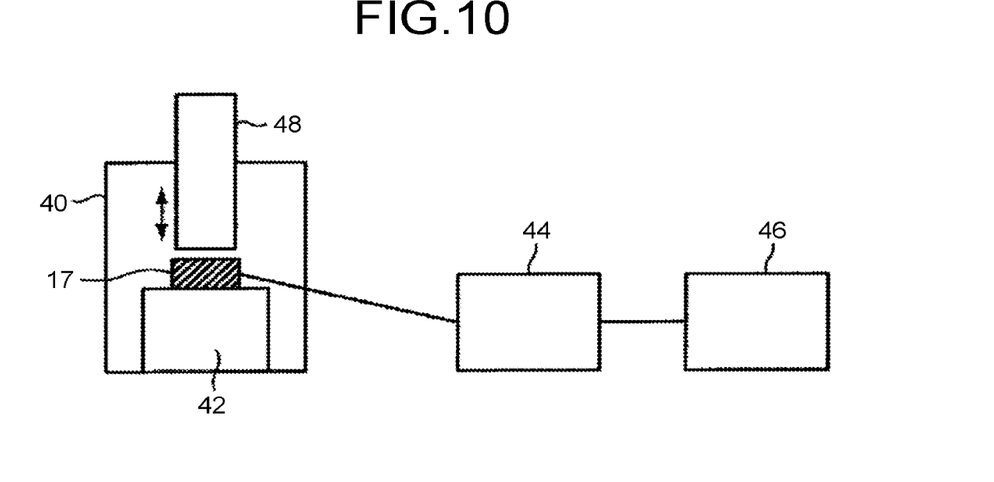
FIG. 10 is a block diagram that illustrates a setup for an evaluation test of the emergency stop pressure sensor.
Figure 11:
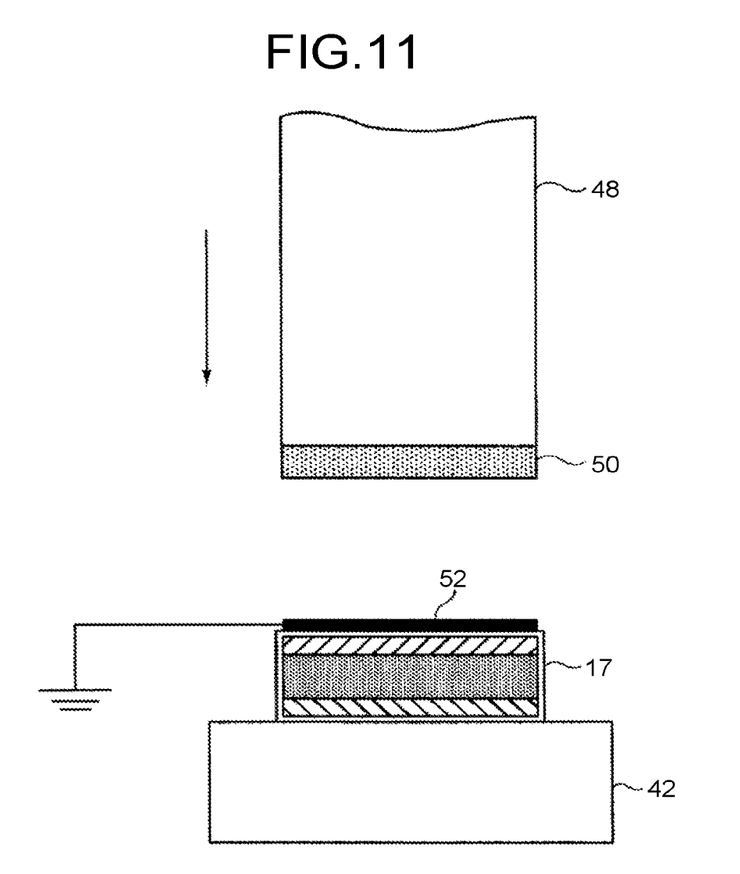
FIG. 11 is a sectional drawing that illustrates a configuration in which a tackiness tester as an evaluation machine presses a probe against a pressure sensor.

(1) As illustrated in FIG. 10, a pressure sensor is attached to a stage 42 of a tackiness tester 40 and is connected with an oscilloscope 46 through a charge amplifier 44.
(2) As illustrated in FIG. 11, a sponge 50 is attached to a front end of a probe 48 and tacking is performed.
(3) A voltage waveform displayed on the oscilloscope 46 is recorded, and average data of three repetitions is defined as an acquired waveform.

Table 1 illustrates specifications of pressure sensors for comparison, Table 2 illustrates specifications of a sponge used for evaluation, Table 3 illustrates settings of a charge amplifier, Table 4 illustrates settings of an oscilloscope, and Table 5 illustrates evaluation conditions of a tackiness tester. As illustrated in Table 1, The PVDF has Young's modulus of 2 GPa, whereas the intermediate layer 4 of the emergency stop pressure sensor 17 according to the embodiment has Young's modulus of 0.01 GPa.

TABLE 1

| Evaluation sensor | PDVF | Emergency stop pressure-sensitive sensor 17 |
|---|---|---|
| Type | Piezo-film sensor | Rubber composition |
| Maker | Tokyo Sensor Co., Ltd. | |
| Model number | DT1-52K/L | |
| Size | 30 mm × 12 mm | 18 mm × 18 mm |
| Thickness | 52 μm | 100 μm |
| Electrode | Ag | Conductive fabric of Seiren Co., Ltd. |
| Protection cover | Acryl | PET |
| Thickness of entire element | 70 μm | 390 μm |
| Hardness (Young's modulus) | 2 GPa | 0.01 GPa |

TABLE 2

Sponge attached to probe

| Material | Silicone rubber |
|---|---|
| Model Number | Si200 |
| Maker | Sunpolymer Corporation |
| Product name | Microcellular silicone rubber sponge sheet |
| Size | φ 10 mm |
| Thickness | 5 mm |
| Hardness of slice surface (Type E) | 15 |

TABLE 3

Settings of charge amplifier

| Device name | Charge amplifier |
|---|---|
| Device model number | 40018-50 |
| Maker | Showa Sokki Corporation |
| PU sens (pC/unit) | 9.99 |
| Cumulative length | Short |
| Range (unit/volt) | 50 |

TABLE 4

Settings of oscilloscope

| Triger (V) | 0.4 |
|---|---|
| Vertical Scale (V) | 2 |
| Horizontal Scale (sec) | 0.25 |
| Model Number | WaveAce 1001 |
| Serial Number | LCRY2150C00538 |
| Software Version | 5.01.02.27 |
| Record length | 11250 |
| Sample interval (sec) | CH: 0.0004 |

TABLE 5

Conditions of measurement using tackiness tester

| Device name | Fixing simulator |
|---|---|
| Device model number | FSR-1000 |
| Maker | Rhesca Co., Ltd. |
| Pattern | 5 (weight control) |
| Indentation speed (mm/sec) | 5 |
| Indentation weight (gf) | 372 |
| Diameter of probe (mm) | 10 |
| Touch detection level (gf) | 20 |
| Indentation stress (Mpa) | 0.05 |
| Indentation retention time (sec) | 1 |
| Drawing-up speed (mm/sec) | 5 |
| Final drawing-up distance (mm) | 3 |
| Plate temperature (° C.) | 25 |

Figure 12:
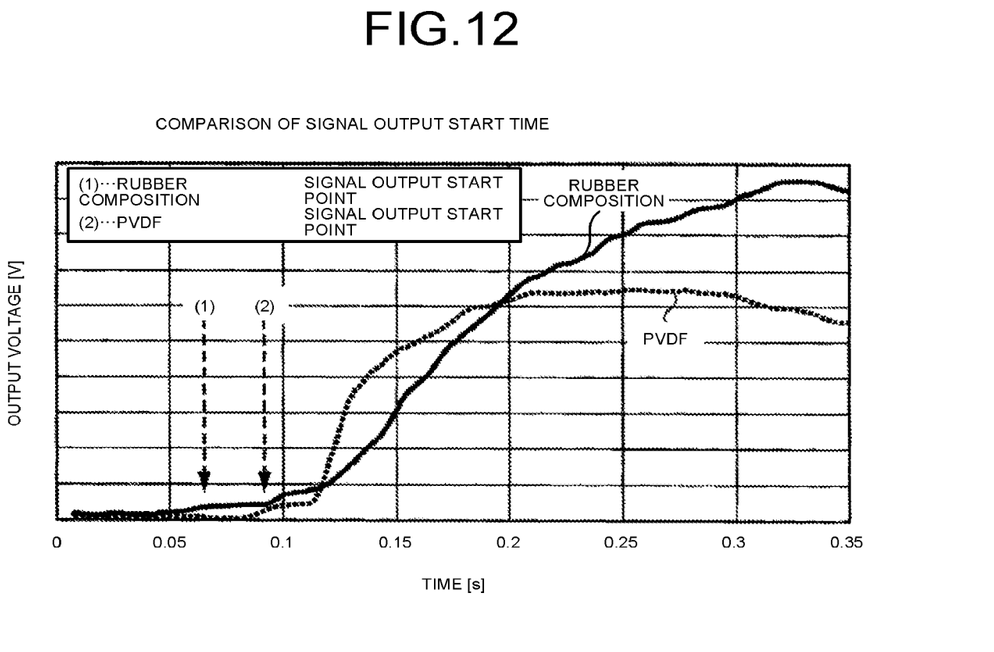
FIG. 12 is a graph of test data obtained in a comparison test of a signal output start time.
Figure 13:
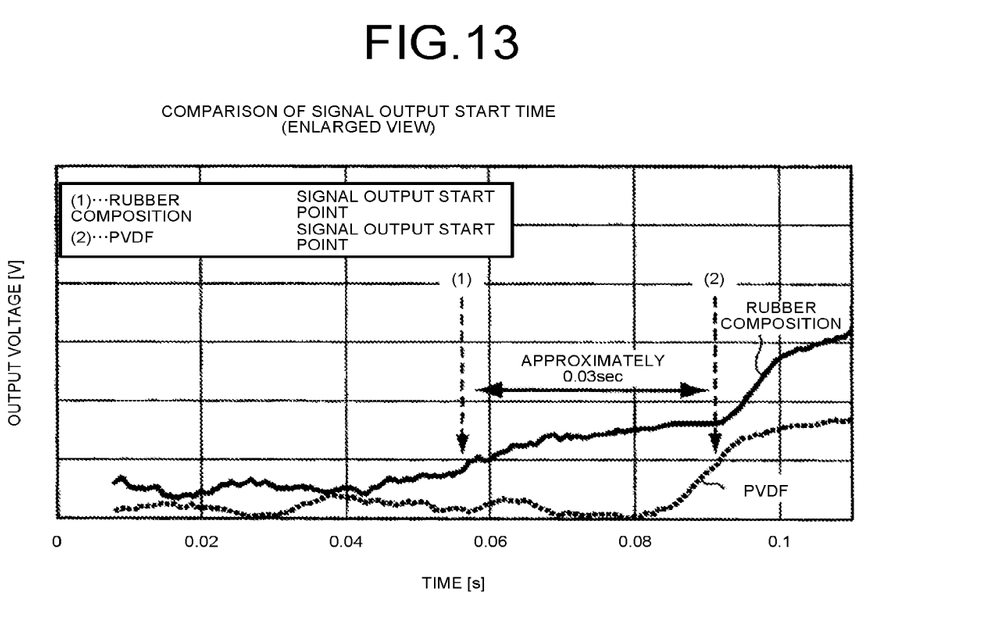
FIG. 13 is an enlarged view of a portion of the signal output start time in FIG. 12.

As illustrated in FIG. 11, a grounded aluminum tape 52 was disposed on the upper surface of the emergency stop pressure sensor 17 so as to prevent occurrence of noise due to unnecessary electric charge. This configuration was employed for measurement of the comparative pressure sensor using PVDF. Results of comparison are illustrated in FIG. 12 and FIG. 13 as a partial enlargement view of FIG. 12. The emergency stop pressure sensor 17 of this embodiment having the intermediate layer 4 made of a rubber composition commences output of a voltage signal after approximately 0.01 sec (10 msec) from contact of the sponge 50 attached to the probe 48 with the emergency stop pressure sensor 17. On the other hand, the pressure sensor using PVDF commences output after approximately 0.04 sec (40 msec). In other words, the pressure sensor has a 0.03 sec (30 msec) delay to the emergency stop pressure sensor 17 according to the embodiment. As described above, PVDF has larger Young's modulus and is therefore harder compared with the intermediate layer 4, which causes PVDF to take a longer time before deformation that triggers output of a voltage signal.

Figure 14:
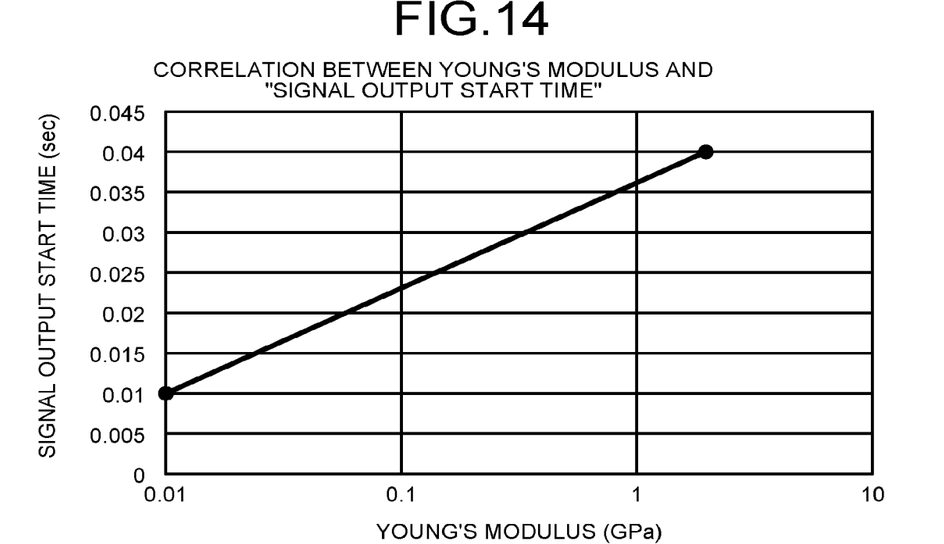
FIG. 14 is a graph that illustrates correlation between Young's modulus and the signal output start time.

An output start time of a voltage signal is based on a time sensed by a pressure sensor installed in the base of the probe 48 of the tackiness tester 40. FIG. 14 is a graph plotting correlation between the signal output start time and measured Young's moduli of the intermediate layer 4 of this embodiment and PVDF. Young's modulus of the intermediate layer and the signal output start time were found to linearly correlate with each other. Young's modulus of the intermediate layer 4 uses a value converted based on hardness at a depth of 10 μm measured by using a measuring device (ultra-micro hardness tester WIN-HUD of Fischerwerke GmbH & Co. KG), which is used for measuring hardness of a rubber composition in later detailed description, and using the same conditions of measurement.

The emergency stop pressure sensor 17 installed in a movable portion of the robot 5 enables immediate sensing of contact of the robot 5 with a contacted body such as a human and an object and further enables immediate transmission of a control signal to a control unit controlling the moving body with little response delay. This configuration can accurately reduce or prevent damage such as injury and breakage. As described above, a pressure sensor using PVDF causes a sensing delay of several ten milliseconds, which inevitably causes a certain degree of progression of damage.

Figure 15:
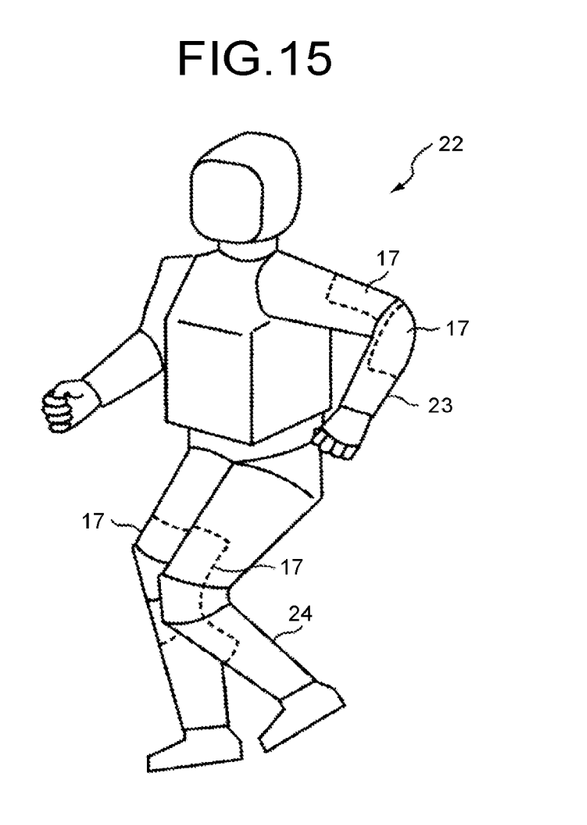
FIG. 15 is a schematic drawing of an exemplary safety system according to a third embodiment.
Figure 16:
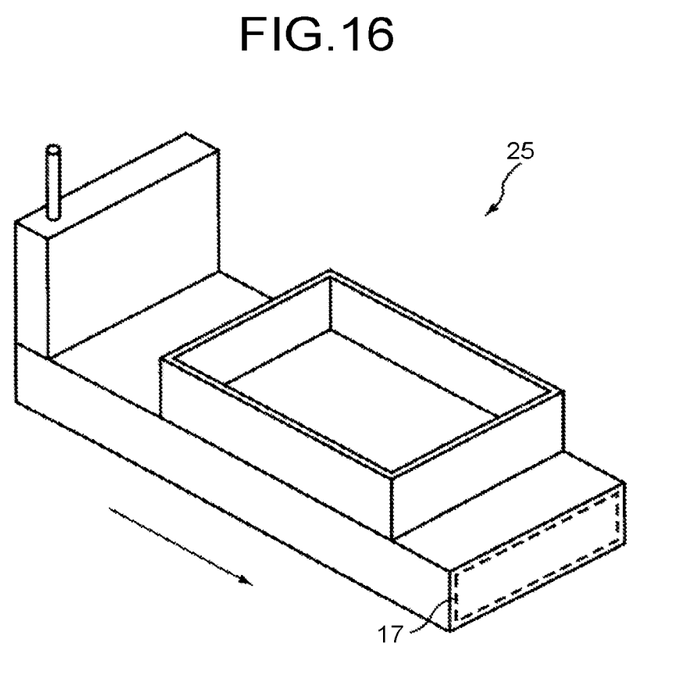
FIG. 16 is a schematic drawing of another exemplary safety system according to the third embodiment.

FIG. 15 and FIG. 16 illustrate a third embodiment. The second embodiment describes exemplary application of the emergency stop pressure sensor 17 to a movable portion of the robot 5 that is stationary, whereas this embodiment describes exemplary application to a movable robot. FIG. 15 illustrates a humanoid robot 22, which serves as a moving body. The emergency stop pressure sensors 17 are installed in arms 23 and legs 24, which serves as movable portions of the humanoid robot 22. A control unit for receiving a signal from the emergency stop pressure sensor 17 is installed in a body unit of the humanoid robot 22.

When a signal is transmitted from the emergency stop pressure sensor 17 with the arm 23 or the leg 24 of the humanoid robot 22 contacting a human or an object, the control unit shuts power transmission to a driving source to the humanoid robot 22. The emergency stop pressure sensor 17 has a quite short sensing time as described above, and a time from contact to stop of driving is therefore short. This configuration can reduce damage resulting from contact or collision. As illustrated in FIG. 16, the emergency stop pressure sensor 17 disposed on a front surface of an automated guided vehicle 25, which is a self-propelled robot, serving as a moving body can exert the same advantageous effects as those in the above-described configurations. The automated guided vehicle 25 has control unit. When the emergency stop pressure sensor 17 outputs a signal upon contact of the automated guided vehicle 25 with a human or an object, the control unit shuts power transmission to a driving source of the automated guided vehicle 25.

Preferred embodiments of the present invention have been described as above; however, the present invention is not limited to a certain embodiment. Various modifications and changes can be made without departing from the scope and the spirit of the present invention described in the appended claims unless otherwise specified in the above description. Advantageous effects described in the embodiments of the present invention are merely examples of most preferable effects exerted by the present invention. Advantageous effects of the present invention are therefore not limited to those described in the embodiments of the present invention.

REFERENCE SIGNS LIST 2 first electrode, which is one of a pair of electrodes
3 second electrode, which is the other one of a pair of electrodes
4 intermediate layer
5, 22, 25 moving body
17 emergency stop pressure sensor
19 control unit
20 safety device
21 safety system

CITATION LIST

Patent Literature

Patent Literature 1: Japanese Patent Application Laid-open No. H9-285992

The invention claimed is:

1. A pressure sensor suitable for being installed in a moving body and suitable for being used with a control unit operative to shut power transmission to a driving source to the moving body in response to a detection signal from the sensor, the pressure sensor comprising:
   a pair of electrodes; and
   an intermediate layer disposed between the pair of electrodes, the intermediate layer comprising silicone or silicone rubber compound, the intermediate layer not having initial surface potential being configured to cause charging to occur between the intermediate layer and the electrodes and generate power when deformed by contact with a target object, wherein
   a proportion of Si-O bonds is increased by surface treatment of the intermediate layer, and
   the silicone rubber compound has siloxane linkage and has a concentration profile in which an oxygen content is increased from a side having a smaller degree of deformation, of the first side and the second side, toward an inside, to have a maximal value inside the intermediate layer, and a carbon content is decreased from the side having a smaller degree of deformation toward the inside, to have a minimal value inside the intermediate layer.

2. The pressure sensor according to claim 1, wherein the emergency stop pressure sensor has a laminate structure in which both sides of the intermediate layer in a thickness direction are sandwiched by the pair of electrodes.

3. The pressure sensor according to claim 2, wherein degrees of deformation to the same deformation adding force are different between a first side and a second side of the intermediate layer in a laminate direction.

4. The pressure sensor according to claim 3, wherein a side having a smaller degree of deformation, of the first side and the second side of the intermediate layer, and an electrode facing the side are provided such that triboelectric charging or separating charging occurs during the deformation.

5. A safety device comprising:
   the pressure sensor according to claim 1; and
   a control unit configured to control movement of the moving body in response to a detection signal from the emergency stop pressure sensor.

6. A safety system comprising:
   the safety device according to claim 5; and
   the moving body.

* * * * *